(12) United States Patent
Shinohara

(10) Patent No.: US 12,163,829 B2
(45) Date of Patent: Dec. 10, 2024

(54) PHOTOELECTRIC CONVERSION APPARATUS

(71) Applicant: CANON KABUSHIKI KAISHA, Tokyo (JP)

(72) Inventor: Mahito Shinohara, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 18/354,057

(22) Filed: Jul. 18, 2023

(65) Prior Publication Data
US 2024/0035885 A1 Feb. 1, 2024

(30) Foreign Application Priority Data

Jul. 27, 2022 (JP) ................. 2022-119834

(51) Int. Cl.
*G01J 1/44* (2006.01)

(52) U.S. Cl.
CPC ........... *G01J 1/44* (2013.01); *G01J 2001/442* (2013.01); *G01J 2001/4466* (2013.01)

(58) Field of Classification Search
CPC . G01J 1/44; G01J 2001/442; G01J 2001/4466
See application file for complete search history.

(56) References Cited

U.S. PATENT DOCUMENTS

| | | | |
|---|---|---|---|
| 7,394,492 B2 | 7/2008 | Shinohara | |
| 7,741,593 B2 | 6/2010 | Iwata et al. | |
| 7,821,551 B2 | 10/2010 | Shinohara | |
| 7,884,870 B2 | 2/2011 | Shinohara | |
| 8,139,133 B2 | 3/2012 | Iwane et al. | |
| 8,164,668 B2 | 4/2012 | Iida et al. | |
| 8,345,137 B2 | 1/2013 | Shinohara et al. | |
| 8,350,942 B2 | 1/2013 | Shinohara | |
| 8,471,942 B2 | 6/2013 | Shinohara | |
| 8,896,734 B2 | 11/2014 | Shinohara | |
| 8,970,769 B2 | 3/2015 | Shinohara et al. | |
| 9,437,647 B2 | 9/2016 | Shinohara | |
| 10,535,688 B2 | 1/2020 | Onuki et al. | |
| 10,714,515 B2 | 7/2020 | Shinohara | |
| 10,771,720 B2 | 9/2020 | Shinohara | |
| 10,818,724 B2 | 10/2020 | Shinohara | |

(Continued)

FOREIGN PATENT DOCUMENTS

JP 2021-089962 A 6/2021

*Primary Examiner* — Thanh Luu
*Assistant Examiner* — Monica T Taba
(74) *Attorney, Agent, or Firm* — Venable LLP

(57) ABSTRACT

A photoelectric conversion apparatus in which a plurality of pixels are arranged is provided. Each of the plurality of pixels includes an avalanche photodiode arranged between a first potential supply line and a second potential supply line, a first switch element arranged between the first potential supply line and the avalanche photodiode, a second switch element arranged between the first switch element and the avalanche photodiode, a capacitive element including a first terminal and a second terminal connected to a first node that connects the first switch element and the second switch element, and a detection circuit configured to detect occurrence of avalanche breakdown of the avalanche photodiode in accordance with a change of a potential of a second node that connects the second switch element and the avalanche photodiode.

21 Claims, 7 Drawing Sheets

(56) References Cited

U.S. PATENT DOCUMENTS

| | | |
|---|---|---|
| 10,944,931 B2 | 3/2021 | Shinohara |
| 11,056,520 B2 | 7/2021 | Onuki et al. |
| 11,503,234 B2 | 11/2022 | Shinohara |
| 11,553,149 B2 | 1/2023 | Shinohara |
| 11,626,431 B2 | 4/2023 | Shinohara et al. |
| 11,728,358 B2 | 8/2023 | Shinohara et al. |
| 2012/0305786 A1* | 12/2012 | Dierickx .................. G01J 1/44 |
| | | 250/371 |
| 2019/0355773 A1* | 11/2019 | Field ................. H01L 27/14634 |
| 2022/0075033 A1* | 3/2022 | Shinozuka ............ G01S 7/4863 |
| 2022/0136896 A1* | 5/2022 | Hirono .................. H01L 31/107 |
| | | 250/214 R |
| 2023/0038959 A1 | 2/2023 | Sekine et al. |
| 2023/0204415 A1* | 6/2023 | Inoue ................. H03K 17/6872 |
| | | 250/200 |

* cited by examiner

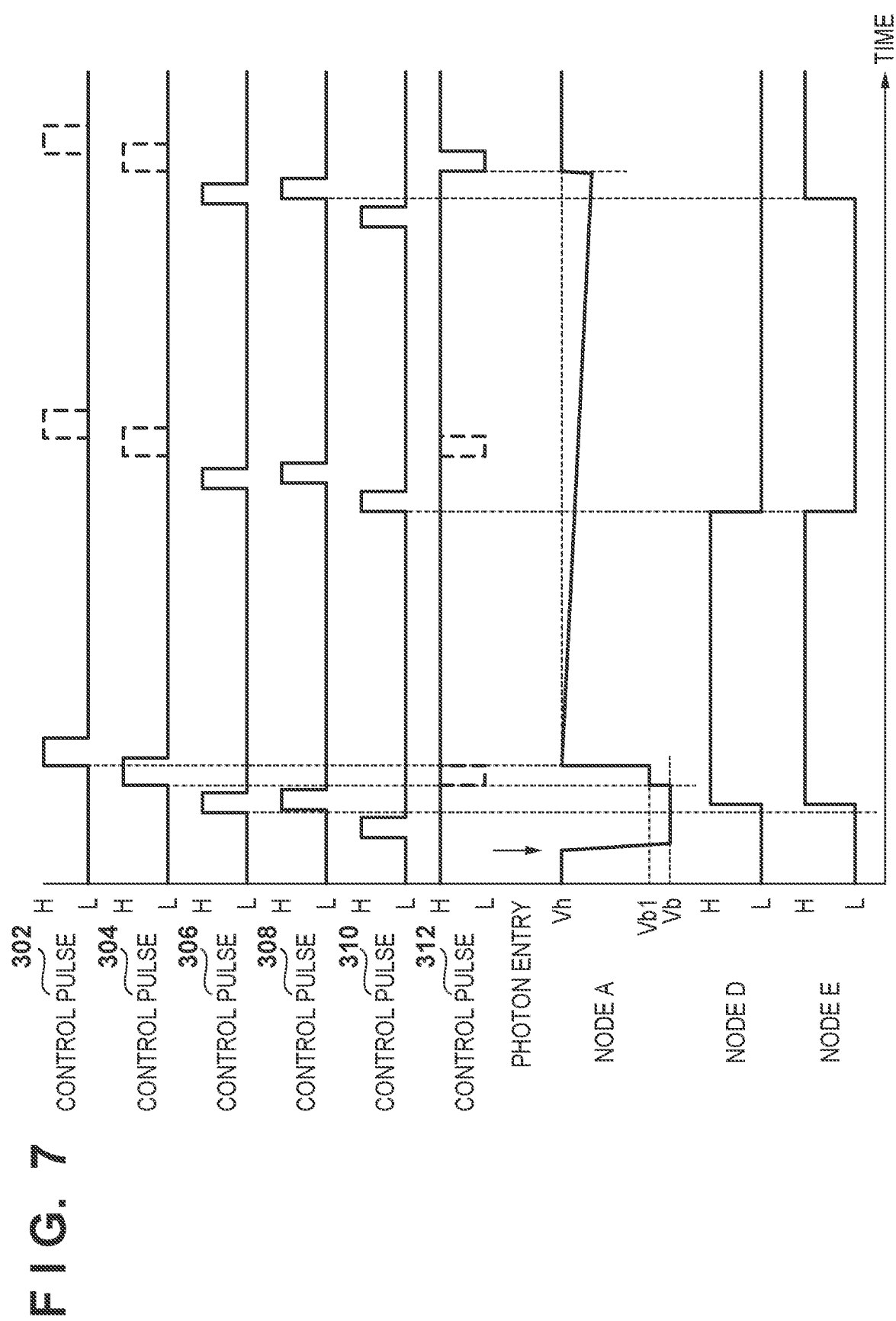

PHOTOELECTRIC CONVERSION APPARATUS

BACKGROUND OF THE INVENTION

Field of the Invention

The present invention relates to a photoelectric conversion apparatus.

Description of the Related Art

A photoelectric conversion apparatus is known in which each pixel is provided with a single photon avalanche photodiode (SPAD) element capable of detecting weak light at the single photon level. Japanese Patent Laid-Open No. 2021-089962 describes a light receiving apparatus in which a SPAD element is arranged in each of a plurality of pixels. In the SPAD element, a voltage obtained by adding an excess voltage to the breakdown voltage of an avalanche photodiode (APD) is applied to the APD. When the breakdown voltage of the APD varies among the pixels, if the same voltage is applied to the APDs of the respective pixels, the value of the excess voltage supplied to the APD varies among the pixels. If the excess voltage varies among the pixels, the uniformity of characteristics in the respective pixels cannot be maintained. Japanese Patent Laid-Open No. 2021-089962 describes that a signal processing unit detects a signal output from an APD, and the detection result is fed back to a bias regulation unit to regulate the value of the excess voltage. More specifically, the signal processing unit detects the characteristic of each APD such as the dead time during which the APD cannot react to a photon, and the bias regulation unit that uses a linear regulator or the like regulates a bias voltage to make the characteristics of the APDs to be uniform.

SUMMARY OF THE INVENTION

In the arrangement described in Japanese Patent Laid-Open No. 2021-089962, the circuit scale of the signal processing unit and the bias regulation unit for regulating the excess voltage that varies among the pixels increases.

Some embodiments of the present invention provide a technique advantageous in ensuring the uniformity of characteristics among pixels while suppressing the circuit scale.

According to some embodiments, a photoelectric conversion apparatus is provided in which a plurality of pixels are arranged, wherein each of the plurality of pixels comprises: an avalanche photodiode arranged between a first potential supply line and a second potential supply line; a first switch element arranged between the first potential supply line and the avalanche photodiode; a second switch element arranged between the first switch element and the avalanche photodiode; a capacitive element including a first terminal and a second terminal connected to a first node that connects the first switch element and the second switch element; and a detection circuit configured to detect occurrence of avalanche breakdown of the avalanche photodiode in accordance with a change of a potential of a second node that connects the second switch element and the avalanche photodiode.

Further features of the present invention will become apparent from the following description of exemplary embodiments (with reference to the attached drawings).

BRIEF DESCRIPTION OF THE DRAWINGS

FIG. 7 is a timing chart showing an example of the operation of the pixel shown in FIG. 6.

DESCRIPTION OF THE EMBODIMENTS

Figure 1:
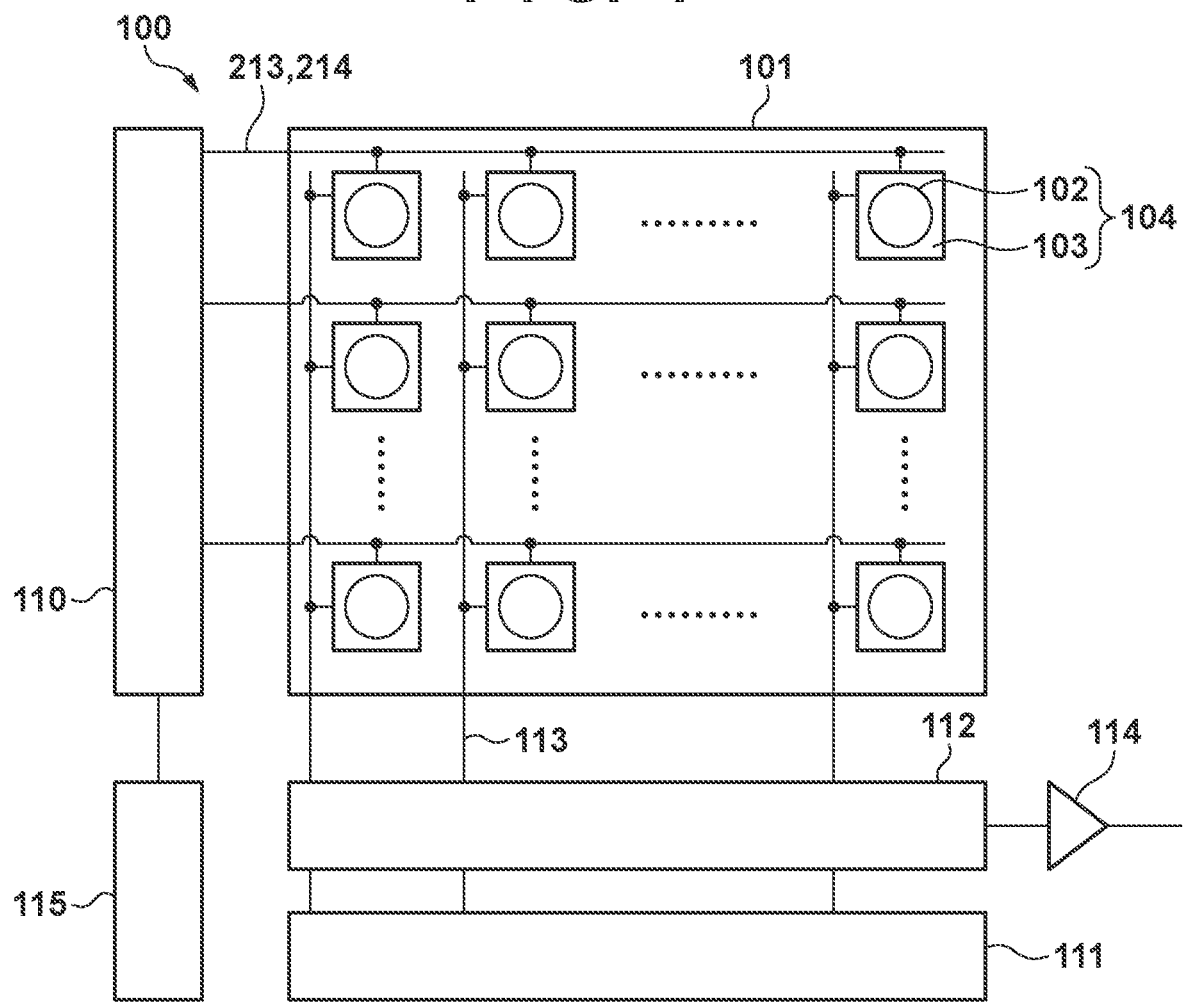
FIG. 1 is a view showing an example of the arrangement of a photoelectric conversion apparatus according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

A photoelectric conversion apparatus according to each embodiment of the present disclosure will be described with reference to FIGS. 1 to 7. In the following embodiment, an electron is a signal carrier, and a single photon avalanche photodiode (to be sometimes referred to as a SPAD hereinafter) element that detects a change of the potential of the cathode of an avalanche photodiode (to be sometimes referred to as an APD hereinafter) caused by an avalanche current generated upon avalanche breakdown of the APD will be described. However, a hole may be the signal carrier, and a change of the potential of the anode of the APD may be detected.

In the present disclosure, a capacitive element is arranged in the cathode of the APD via a switch element, as will be described in detail later. The capacitance of the cathode of the APD is C0, and the capacitance of the capacitive element is C1. With reference to the potential of the anode of the APD, the potential of the cathode of the APD immediately after avalanche breakdown occurs due to a signal electron is a breakdown voltage Vbd of the APD. With respect to the cathode, if a pulse of a voltage Vp is applied to the capacitance C1, the potential of the cathode rises by $C1/(C0+C1) \times V$ due to capacitance division. This voltage is an excess voltage Vex. After that, if the switch element is turned off, the cathode is reset to a potential (Vbd+Vex).

The present disclosure is based on the premise that the variation in the excess voltage Vex is sufficiently smaller than the variation in the breakdown voltage Vbd. If the variation in the excess voltage Vex is not sufficiently smaller than the variation in the breakdown voltage Vbd, the problem of the variation in the breakdown voltage Vbd is simply replaced by the problem of the variation in the excess voltage Vex. Establishment of this premise will first be described below.

The capacitance C0 of the cathode and the capacitance C1 of the capacitive element vary about several % depending on the condition. Assume that each variation value is set to 5%. By following examples of numerical values used in the embodiment to be described later, if C0=3 fF and C1=2 fF are set, and the design value of the excess voltage Vex to be applied to the APD is set to 2.0 V, a pulse voltage Vp to be applied to the capacitance C1 is 5 V. The variation only in the capacitance C0 causes a capacitance division ratio C1/(C0+C1) to vary about 3.0%. Similarly, the variation only in the capacitance C1 also causes the capacitance division ratio to vary about 3.0%. The variations in the capacitances C0 and C1 cause the capacitance division ratio to vary 3.0%×√2 which is about 4.2%. On the other hand, the variation in the breakdown voltage Vbd of the APD is about 500 mV depending on the condition. Therefore, the variation in the excess voltage Vex is estimated to be 1.5 V to 2.5 V×4.2%, which is about 63 mV to 105 mV. As described above, 105 mV as the estimated maximum value of the variation in the excess voltage Vex is sufficiently smaller than the variation (±500 mV) in the breakdown voltage Vbd of the APD. That is, the premise of the present disclosure that the variation in the excess voltage Vex is sufficiently smaller than the variation in the breakdown voltage Vbd of the APD is sufficiently realistic.

FIG. 1 is a block diagram showing an example of the arrangement of a photoelectric conversion apparatus 100 according to the first embodiment of the present disclosure. The photoelectric conversion apparatus 100 includes a pixel unit 101, a control pulse generation circuit 115, a horizontal scanning circuit 111, a readout circuit 112, signal lines 113, and a control circuit 110. A plurality of pixels 104 are arranged in a matrix in the pixel unit 101. Each pixel 104 includes a photoelectric conversion unit 102 including an APD and a signal processing circuit 103. The photoelectric conversion unit 102 converts light having entered the pixel 104 into an electrical signal. The signal processing circuit 103 outputs, to the readout circuit 112, the electrical signal generated by the photoelectric conversion unit 102 in accordance with the incident light.

In accordance with a pulse signal supplied from the control pulse generation circuit 115, the control circuit 110 supplies a control pulse to each pixel 104. Therefore, it can be said that the control circuit 110 controls the operation of each pixel 104. A logic circuit such as a shift register or an address decoder can be used for the control circuit 110.

The signal output from the photoelectric conversion unit 102 of the pixel 104 is processed by the signal processing circuit 103. A counter, a memory, and the like may be arranged in the signal processing circuit 103, and the memory may hold a digital value counted by the counter.

In order to read out the signal from the memory of the pixel 104 holding the digital signal, the horizontal scanning circuit 111 inputs, to the signal processing circuit 103, a control pulse for sequentially selecting the pixels 104 for each column. The signal processing circuit 103 of the pixel 104 selected by the control circuit 110 outputs the signal to the signal line 113. The signal output to the signal line 113 is output, via an output circuit 114, to a signal processing apparatus or the like arranged outside the photoelectric conversion apparatus 100, and can be, for example, displayed as a captured image on a display device.

As shown in FIG. 1, the pixels 104 may be arranged in an array, but the present invention is not limited to this. For example, the pixels 104 may be arranged one-dimensionally (in a line). Furthermore, the function of the signal processing circuit 103 is not necessarily provided for each of all the pixels 104. For example, one signal processing circuit 103 may be shared by the plurality of pixels 104, and sequentially perform signal processing.

Figure 2:
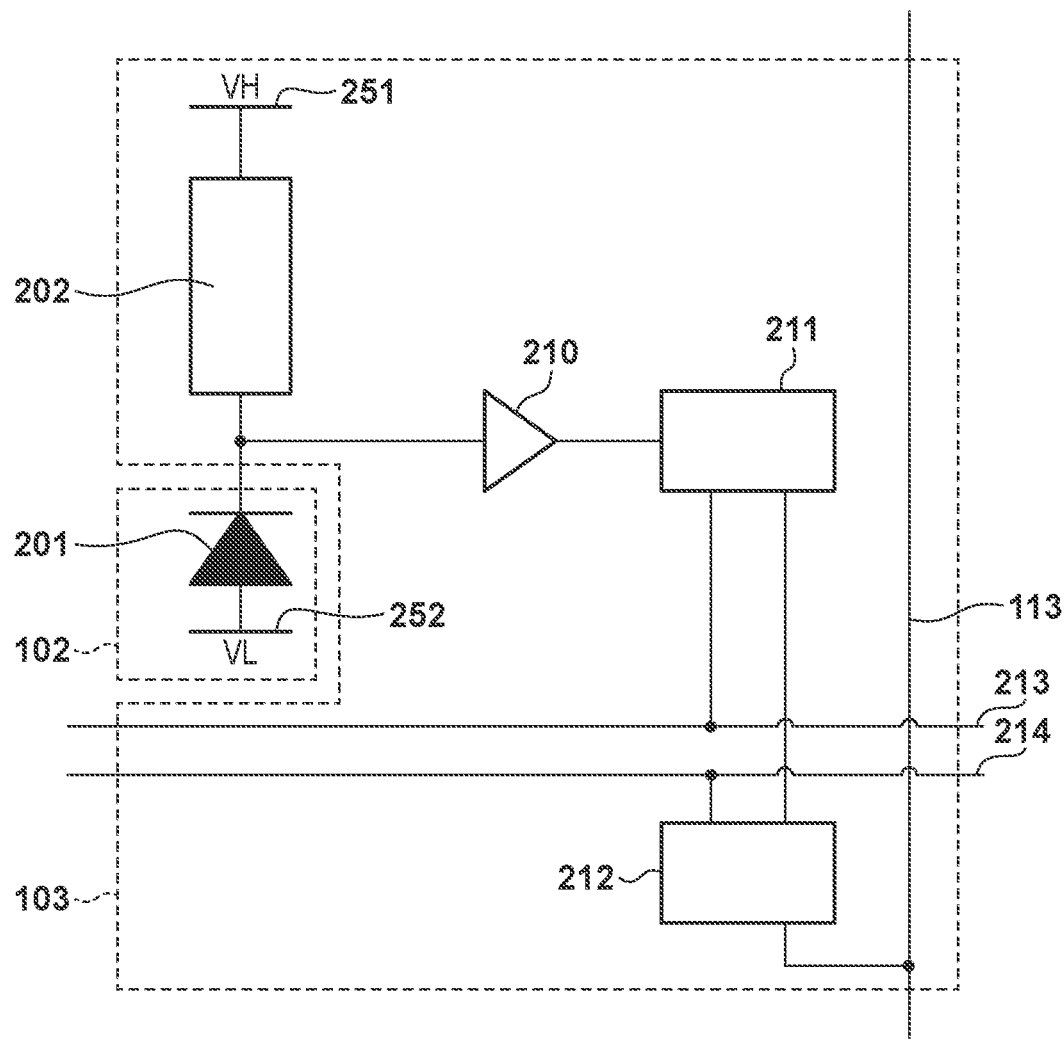
FIG. 2 is a view for explaining an example of the arrangement of a pixel arranged in the photoelectric conversion apparatus shown in FIG. 1.

FIG. 2 is a block diagram for explaining an example of the arrangement of the pixel 104 arranged in the photoelectric conversion apparatus 100, and for explaining a SPAD element including an APD. In the pixel 104, an avalanche photodiode (APD) 201 is arranged between potential supply lines 251 and 252. The APD 201 generates electric charge pairs corresponding to incident light by photoelectric conversion. A voltage VL is supplied to the anode of the APD 201 from the potential supply line 252. A voltage VH higher than the voltage VL supplied to the anode is supplied to the cathode of the APD 201 from the potential supply line 251. A reverse bias voltage that causes the APD 201 to perform an avalanche breakdown operation is supplied between the anode and the cathode. By setting a state in which these voltages are supplied, electric charges generated by the incident light cause avalanche multiplication, thereby generating an avalanche current (avalanche breakdown).

In the operation of the APD 201, there are a Geiger mode which is operated in a state in which the potential difference (voltage) between the anode and the cathode is higher than the breakdown voltage Vbd, and a linear mode which is operated in a state in which the voltage between the anode and the cathode is around or lower than the breakdown voltage. The APD operated in the Geiger mode is called the SPAD element. In a case where the breakdown voltage Vbd of the APD 201 is 30 V, for example, the voltage VL is set to −30 V, and the voltage VH is set to 3 V.

The signal processing circuit 103 can include a waveform shaping circuit 210, a count circuit 211, and a selection circuit 212. The signal processing circuit 103 may also include a quenching element 202. The quenching element 202 is arranged between the APD 201 and the potential supply line 251 that supplies the voltage VH. The quenching element 202 has a function of replacing, by a voltage signal, a change of the avalanche current generated in the APD 201. The quenching element 202 functions as a load circuit (quenching circuit) at the time of signal multiplication by avalanche breakdown, and serves to suppress avalanche breakdown by suppressing the voltage supplied to the APD 201 (quenching operation). The quenching element 202 may be, for example, a resistor element, and a transistor or the like may function as a load.

The waveform shaping circuit 210 is connected to the node connected to the cathode or anode of the APD 201, and outputs a signal based on the potential of the electrode (cathode or anode) of the APD 201. In this embodiment, although the operation of the waveform shaping circuit 210 will be described later with reference to FIGS. 3A to 3C, the waveform shaping circuit 210 outputs a pulse signal by shaping the change of the potential of the cathode of the APD 201 obtained when a photon enters the APD 201. That is, the waveform shaping circuit 210 has a function as a detection circuit for detecting occurrence of avalanche breakdown of the APD 201 in accordance with the change of the potential. As the waveform shaping circuit 210, for example, an inverter circuit is used. In the arrangement shown in FIG. 2, an example is shown in which one inverter is used as the waveform shaping circuit 210. However, for example, a circuit in which a plurality of inverters are connected in series may be used. Any circuit may be used as the waveform shaping circuit 210 as long as the circuit can shape the change of the potential of the APD 201 into a desired waveform and detect occurrence of avalanche breakdown of the APD 201.

The count circuit 211 can include a counter that counts the number of times the waveform shaping circuit 210 outputs the pulse signal, and a memory that holds the count value (number of times). If a control pulse is supplied from the control circuit 110 via a driving line 213, the count value held by the count circuit 211 is reset.

The selection circuit 212 is supplied with a control pulse from the control circuit 110 via a driving line 214, thereby switching an electric connection/disconnection between the count circuit 211 and the signal line 113. If the count circuit 211 and the signal line 113 are electrically connected, a count value is output from the count circuit 211 to the signal line 113. The selection circuit 212 may include, for example, a buffer circuit or the like for outputting a signal.

A switch element such as a transistor may be arranged between the quenching element 202 and the APD 201 or between the photoelectric conversion unit 102 and the signal processing circuit 103 to switch an electric connection. Similarly, supply of the voltage VH or the voltage VL supplied to the photoelectric conversion unit 102 may be electrically switched using a switch element such as a transistor.

In this embodiment, an arrangement in which the count circuit 211 is arranged in the signal processing circuit 103 is shown. However, the present invention is not limited to this. A Time to Digital Converter (TDC) and a memory may be used in place of the count circuit 211 to form the photoelectric conversion apparatus 100 that acquires a pulse detection timing. In this case, the generation timing of the pulse signal output from the waveform shaping circuit 210 is converted into a digital signal by the TDC. The TDC can be supplied with a control pulse (reference signal) from the control circuit 110 via a driving line to measure the timing of the pulse signal. The TDC acquires, as a digital signal, a signal obtained when the input timing of the signal output from the APD 201 via the waveform shaping circuit 210 is set as the relative time with reference to the control pulse.

Figure 3B:
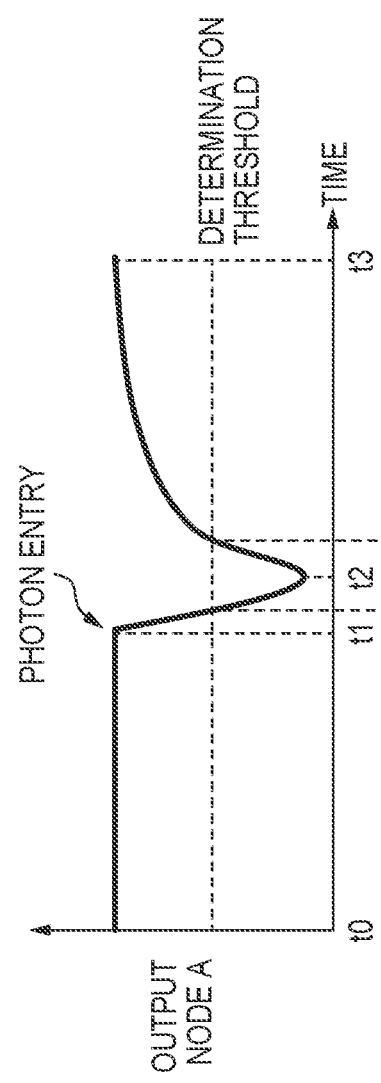
FIGS. 3A to 3C are views showing signal waveforms at a node A and a node B of the pixel shown in FIG. 2.
Figure 3C:
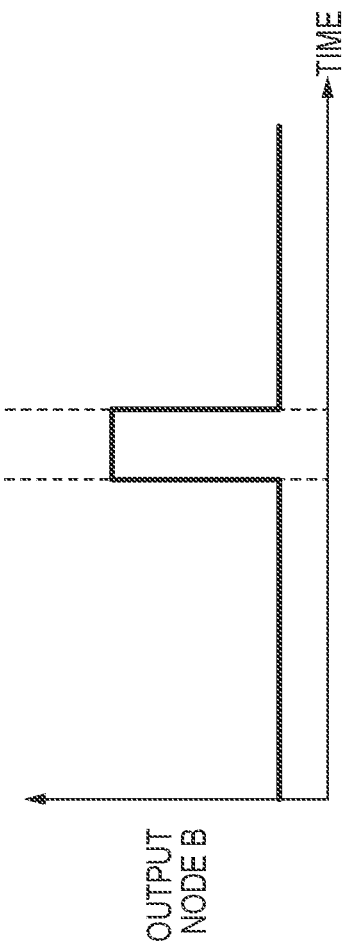
Figure 3A:
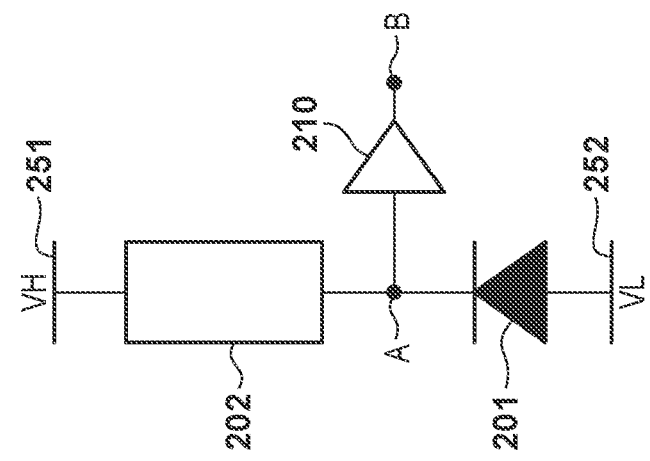

FIGS. 3A to 3C are views schematically showing the relationship between the operation of the APD 201 and the output signal of the waveform shaping circuit 210. As shown in FIG. 3A, the node representing the potential of the cathode of the electrodes of the APD 201 is indicated by a node A. Furthermore, the node representing the potential of the output of the waveform shaping circuit 210 is indicated by a node B. FIGS. 3B and 3C show the waveform changes of the node A and the node B, respectively.

Between time t0 and time t1, a voltage (VH−VL) is applied to the APD 201. As shown in FIG. 3B, when a photon enters the APD 201 at time t1, an avalanche current flows through the quenching element 202, and the potential of the node A drops. When the drop amount of the potential of the node A further increases and the voltage applied to the APD 201 decreases, the avalanche breakdown of the APD 201 stops, and the potential level of the node A does not drop below a predetermined value (time t2). After that, a current that compensates for the drop in potential flows from the potential supply line 251 to the node A, and the node A is stabilized at the original potential level at time t3. As shown in FIG. 3C, when avalanche breakdown of the APD 201 has occurred and the output waveform exceeds a predetermined threshold at the node A, the waveform shaping circuit 210 shapes the output waveform at the node A and outputs a signal (pulse signal) to the node B. The occurrence of the avalanche breakdown of the APD 201 is detected by the pulse signal output from the waveform shaping circuit 210.

In the arrangement shown in FIG. 1, it is shown that the signal processing circuit 103 and the scanning circuits and the like around the pixel unit 101 are formed on the same semiconductor substrate as the APD 201. However, the present invention is not limited to this, and the signal processing circuit 103 and the scanning circuits and the like around the pixel unit 101 may be formed on a semiconductor substrate different from the pixel unit 101 in which the APD 201 is arranged. In this case, the substrate including the pixel unit 101 where the pixels 104 each including the APD 201 are arranged and the substrate where the signal processing circuit 103 and the like are arranged may be stacked.

In the following embodiment, a switch element is arranged in place of the quenching element 202, and the embodiment is based on an operation of setting this switch element to an ON state or OFF state. Although details will be described below, the node A is in a floating state in the OFF state of the switch element. In this case, if a signal electron enters the APD 201 to cause an avalanche, the potential of the node A is set to a potential (VL+Vbd) lower than the voltage VH. The same applies regardless of whether the number of signal electrons entering the APD 201 is one or more. If no signal electron enters, the potential of the node A is the voltage VH. If it is detected that the potential of the node A is set to the potential (VL+Vbd), that is, avalanche breakdown occurs, the switch element changes to the ON state under the control of the control circuit 110, and the node A is reset by capacitive coupling.

Figure 4:
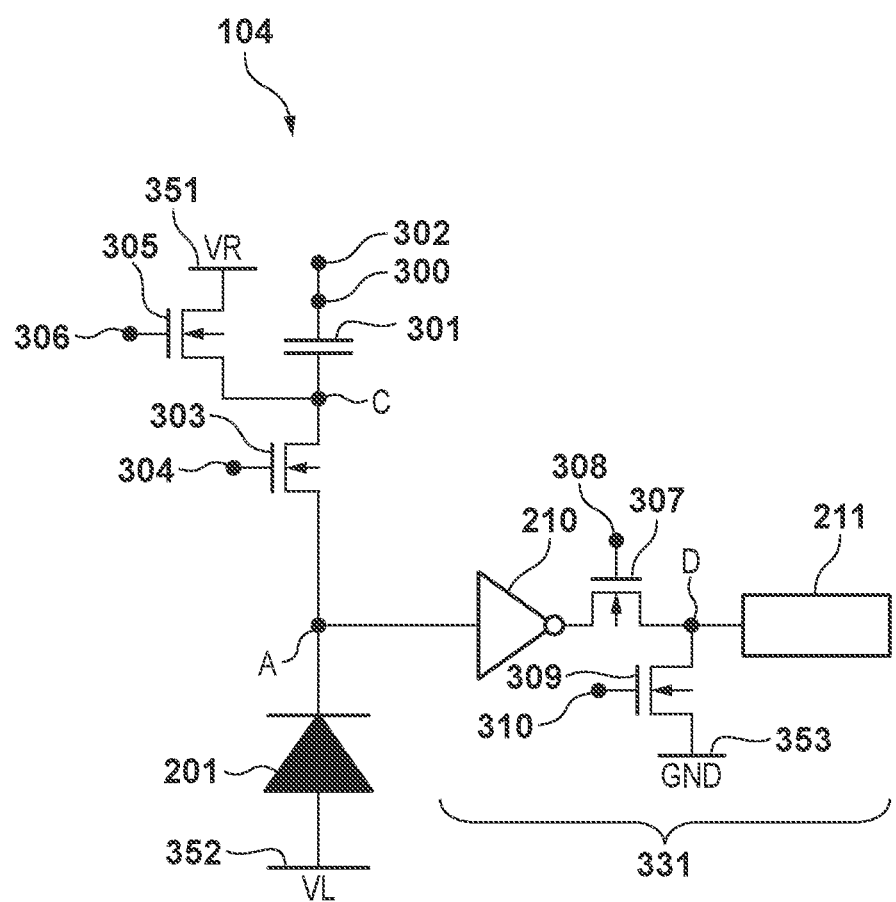
FIG. 4 is an equivalent circuit diagram showing an example of the arrangement of the pixel shown in FIG. 2.

The arrangement and operation of the pixel 104 according to this embodiment will now be described in detail. FIG. 4 is an equivalent circuit diagram showing an example of the arrangement of the pixel 104 according to this embodiment. The pixel 104 includes the APD 201 arranged between potential supply lines 351 and 352, a switch element 305 arranged between the potential supply line 351 and the APD 201, a switch element 303 arranged between the switch element 305 and the APD 201, and a capacitive element 301 including a first terminal 300 and a second terminal connected to a node C that connects the switch elements 305 and 303. As shown in FIG. 4, each of the switch elements 305 and 303 can be an n-type MOS transistor.

Furthermore, the pixel 104 includes a detection circuit 331 for detecting occurrence of avalanche breakdown of the APD 201 in accordance with a change of the potential of the node A that connects the switch element 303 and the APD 201. The node A is a node representing the potential of the cathode of the electrodes of the APD 201. The detection circuit 331 includes the above-described waveform shaping circuit 210 and count circuit 211. As shown in FIG. 4, the waveform shaping circuit 210 may be an inverter that is connected to the node A and outputs a signal (pulse signal) indicating detection of avalanche breakdown in accordance with the change of the potential of the node A. The detection circuit 331 can further include a switch element 307 arranged between the waveform shaping circuit 210 and the count circuit 211, and a switch element 309 arranged between a potential supply line 353 and a node D that connects the switch element 307 and the count circuit 211. Each of the switch elements 307 and 309 can be an n-type MOS transistor. The potential supply line 353 is supplied with a ground voltage GND.

Figure 5:
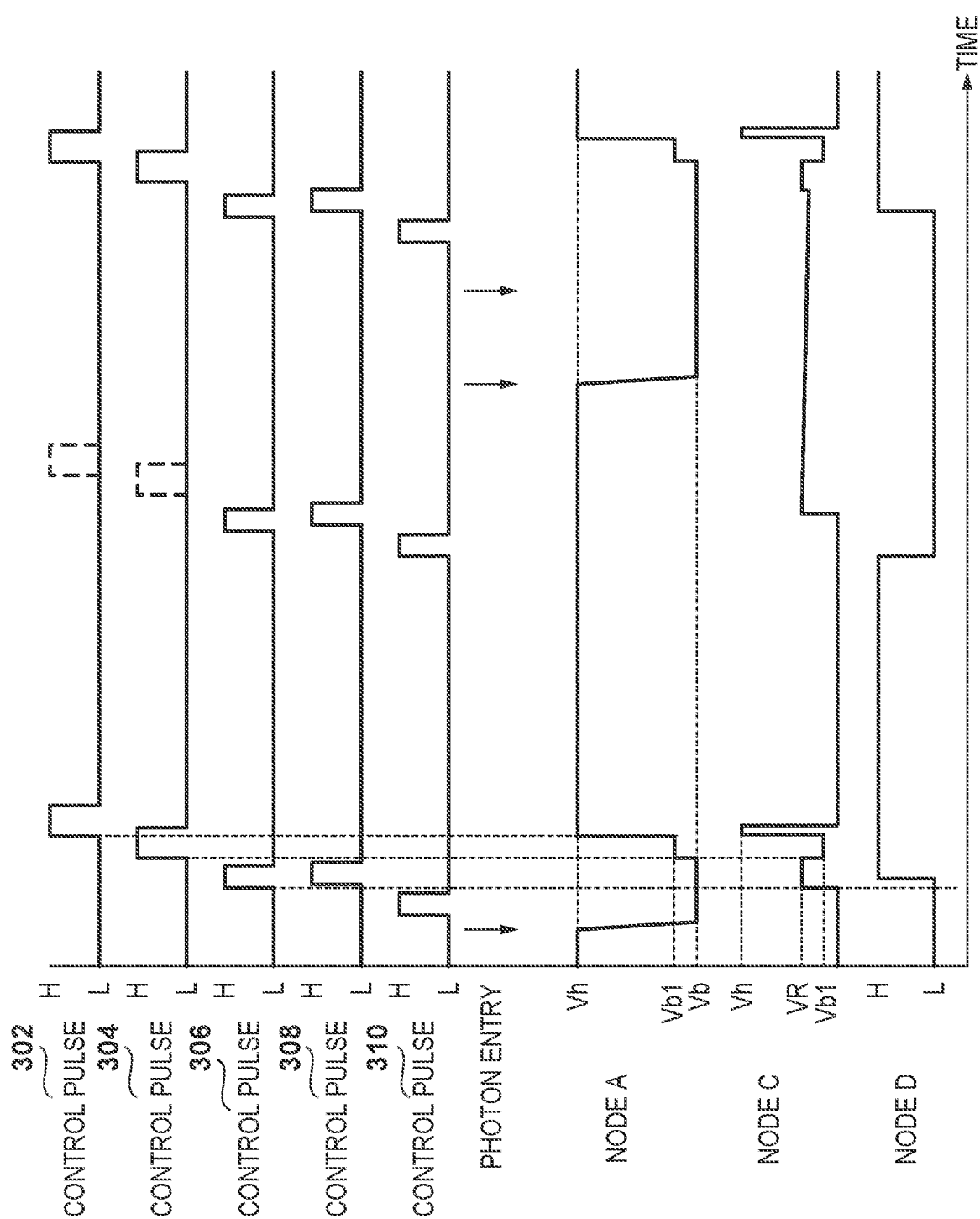
FIG. 5 is a timing chart showing an example of the operation of the pixel shown in FIG. 4.

FIG. 5 is a timing chart for explaining an example of the operation of the pixel 104 according to this embodiment. A control pulse 302 is a signal input to the first terminal 300 of the capacitive element 301. While the control pulse 302 is at H level, the voltage Vp is supplied to the first terminal 300 of the capacitive element 301. A control pulse 304 is a signal input to the control terminal of the switch element 303. A control pulse 306 is a signal input to the control terminal of the switch element 305. A control pulse 308 is a signal input to the control terminal of the switch element 307. A control pulse 310 is a signal input to the control terminal of the switch element 309. While the control pulses 304, 306, 308, and 310 are at H level, the switch elements 303, 305, 307, and 309 are in the ON state, respectively, and while the control pulses 304, 306, 308, and 310 are at L level, the switch elements 303, 305, 307, and 309 are in the OFF state, respectively. The control pulses 302, 304, 306, 308, and 310 can be supplied from the control circuit 110 via the driving lines. FIG. 5 shows changes of the potentials of the control pulses 302, 304, 306, 308, and 310 and the nodes A, C, and D. In FIG. 5, a timing at which a photon enters the APD 201 is indicated by "↓".

Prior to a description of the operation, the relationship among the voltages (potentials) of the components of the pixel 104 will be described. Assume that the designed breakdown voltage Vbd of the APD 201 is 30 V and varies within a range of ±0.5 V. Assume that the design value of the excess voltage Vex applied to the APD 201 is 2.0 V. Assume also that the voltage VL supplied to the potential supply line 352 is −29.5 V. If the potential of the node A immediately after avalanche breakdown of the APD 201 occurs is a potential Vb, Vb=(VL+Vbd) is obtained. In a case where the breakdown voltage Vbd of the APD is 30.5 V, Vb=1.0 V is obtained. In a case where the breakdown voltage Vbd is 29.5 V, Vb=0.0 V is obtained.

The operation of the pixel 104 will be described next. In this embodiment, the node A connected to the cathode of the APD 201 basically operates in the floating state. As will be described later, the potential of the node A is reset to a potential Vh, and if the APD 201 captures a signal electron to cause avalanche breakdown, the potential of the node A drops to the potential Vb. The switch element 307 periodically, electrically connects the output unit of the waveform shaping circuit 210 using the inverter and the node D as the input unit of the count circuit 211 by the control pulse 308 periodically applied with an H-level pulse. By the control pulse 310 slightly preceding the control pulse 308, the potential of the node D is reset to the ground voltage GND, that is, L level. In a case where the control pulse 308 is at H level, when the potential of the node D changes from L level to H level, the count value of the count circuit 211 is counted up. That is, if the potential of the node A is the potential Vb when the control pulse 308 is set to H level, the count value of the count circuit 211 is counted up by one. This detects occurrence of avalanche breakdown of the APD 201. A threshold voltage at which the waveform shaping circuit 210 using the inverter outputs a signal indicating detection of avalanche breakdown may be, for example, 1.5 V in the case of the above-described voltage (potential) relationship.

Next, the reset operation of the node A will be described. The reset operation is performed by the control pulses 302, 304, and 306 supplied from the control circuit 110. However, basically, only in a case where the potential of the node A is the potential Vb, the reset operation is performed. The control circuit 110 performs the reset operation of resetting the potential of the node A in response to detection of avalanche breakdown by the detection circuit 331. That is, in a case where the potential of the node A is the potential Vh, the reset operation need not be performed. More specifically, in a case where the potential of the node is the potential Vh, the control pulses 302 and 304 need not be set to H level. For this discrimination processing, a logical product (AND operation) of the level of the node D and a control pulse serving as the base of the control pulses 302 and 304 and periodically set to H level may be performed, thereby supplying the control pulses 302 and 304. In the timing chart shown in FIG. 5, H-level pulses indicated by dotted lines of the control pulses 302 and 304 represent control pulses serving as the base of the control pulses 302 and 304 and periodically set to H level before the AND operation is performed. In the pixel 104 in which the node D is at L level, that is, the potential of the node A is the potential Vh, the control pulses 302 and 304 are maintained at L level, as indicated by solid lines.

As described above, the detection circuit 331 performs an operation of detecting avalanche breakdown of the APD 201 at a predetermined period. The reset operation of the node A is configured to be performed at the same period as the period at which the detection circuit 331 detects avalanche breakdown. If the detection circuit 331 detects no avalanche breakdown, for example, the control circuit 110 does not perform the reset operation of the node A using the above-described AND operation and the like regardless of the timing at which the reset operation can be performed. On the other hand, if the detection circuit 331 detects avalanche breakdown of the APD 201, the control circuit 110 performs the reset operation to be described below. The control circuit 110 can perform the reset operation at a timing immediately after the detection circuit 331 detects avalanche breakdown, among timings at which the reset operation can be performed.

Next, consider a case where when the node D is set to H level, a photon enters the APD 201 to cause avalanche breakdown, and the potential of the node A changes to the potential Vb. In this example, the capacitance of the node A is set to the above-described capacitance C0 of the cathode, and the capacitance of the node C is almost equal to the capacitance C1 of the capacitive element 301. The values of the capacitances C0 and C1 are, for example, C0=3 fF and C1=2 fF, as described above. Assume that a voltage VR supplied to the potential supply line 351 is set to, for example, 0.5 V that is equal to the average value (the potential Vb in a case where the breakdown voltage Vbd of the APD 201 is 30 V) of the potential Vb. In the following description, a case where the breakdown voltage Vbd of the APD 201 varies and Vbd=29.5 V will mainly be explained.

If the control pulse 306 is set to H level, the potential of the node C is set to 0.5 V in accordance with the voltage VR of the potential supply line 351. At this time, the potential Vb of the node A is Vb=(VL+Vbd)=0.0 V. Next, if an H-level pulse is applied to the control pulse 304, the nodes A and C are electrically connected, and the potential is given by:

$$(Vb \times C0 + VR \times C1)/(C0+C1) \tag{1}$$

In the above-described voltage (potential) relationship, 0.2 V is obtained. In this state, the control pulse 302 is set to H level, and the voltage Vp is applied to the first terminal 300 of the capacitive element 301. At this time, with respect to the design value of the excess voltage Vex, the value of the voltage Vp is set to obtain:

$$\text{excess voltage } Vex = \{C1/(C0+C1)\} \times Vp \tag{2}$$

In the above-described voltage (potential) relationship, the design value of the excess voltage Vex is 2.0 V, and thus the voltage Vp is 5.0 V. Therefore, depending on the voltage Vp applied to the first terminal 300 of the capacitive element 301, the potentials of the nodes A and C are increased by the excess voltage Vex due to capacitive coupling between the capacitance C0 of the cathode of the APD 201 and the capacitance C1 of the capacitive element 301. In the above-described voltage (potential) relationship, the potential is increased by 2.0 V from 0.2 V, thereby obtaining 2.2 V. In this state, if the control pulse 304 is set to L level and the switch element 303 is set in the OFF state, the reset of the node A is completed. In the above-described voltage (potential) relationship, the potential Vh of the node A is reset to 2.2 V.

As described above, in the reset operation, the control circuit 110 sets the switch element 303 to the ON state, and applies the predetermined voltage Vp to the first terminal 300 of the capacitive element 301. After applying the predetermined voltage Vp to the first terminal 300 of the capacitive element 301, the control circuit 110 sets the switch element 303 from the ON state to the OFF state, and then ends the application of the voltage Vp to the first terminal 300 of the capacitive element 301. Before performing the reset operation, the control circuit 110 sets the switch element 305 to the ON state, and resets the node C to the voltage VR supplied from the potential supply line 351. This resets the node A to the potential Vh. After performing the reset operation, the control circuit 110 controls the switch element 303 to the OFF state until the detection circuit 331 detects avalanche breakdown of the APD 201. Thus, as described above, while the APD 201 performs an operation of detecting a photon, the node A basically operates in the floating state.

When the control pulse 302 returns to L level in the reset operation, the potential of the node C is to drop by the voltage Vp due to capacitive coupling between the capacitances C0 and C1. In the above-described voltage (potential) relationship, the potential of the node C is to drop by 5 V from 2.2 V. If the potential of the node C is a negative potential, a forward bias is applied to the GND potential setting well of the switch element 303 as an n-type MOS transistor, and the forward bias current of the switch element 303 may flow to the node A. However, by appropriately setting thresholds Vth of the switch elements 303 and 305, it is possible to avoid the forward bias current of the switch element 303 from flowing to the node A. For example, the threshold Vth of the switch element 303 is set to 0.6 V and the threshold Vth of the switch element 305 is set to 0.0 V. That is, the threshold of the switch element 305 is set to be lower than the threshold of the switch element 303. With these settings, the potential of the node C is clipped to 0.0 V. This is because, in a case where the potential is 0.0 V or lower, the switch element 305 as an n-type MOS transistor is set to the ON state and the node C and the potential supply line 351 are electrically connected to each other. This avoids a leakage current to the node A via the switch element 303.

The above-described operation of setting the node A to the potential Vh after avalanche breakdown of the APD 201 occurs is the reset operation of the node A using capacitive coupling between the capacitance C0 of the node A (the cathode of the APD 201) and the capacitance C1 of the node C (the capacitive element 301). In the example of the timing chart shown in FIG. 5, a case is shown in which no photon enters the APD 201 before the next reset timing and the node A is not reset but the node A is reset again at the next reset timing. A case where if the node D is at L level, the control pulse 302 is not set to H level has been described above but the present invention is not limited to this. The control pulse 302 may periodically be supplied with an H-level pulse, similar to the control pulses 306, 308, and 310, regardless of the state of the node D. This is because if the switch element 303 is in the OFF state, even if the voltage Vp is supplied to the first terminal 300 of the capacitive element 301 by the control pulse 302, the node A is not influenced.

As described above, the variation in the breakdown voltage Vbd is reflected on the excess voltage Vex applied to the pixel 104 to some extent. For example, when ΔVbd represents the variation in the breakdown voltage Vbd and ΔVex represents the variation in the excess voltage Vex, $$\Delta Vex = C0/(C0+C1) \times \Delta Vbd \quad (3)$$

In the above-described voltage (potential) relationship, ΔVbd=0.5 V and ΔVex=0.2 V. More specifically, the excess voltage Vex is 2.2 V in a case where the breakdown voltage Vbd is 29.5 V, and the excess voltage Vex is 1.8 V in a case where the breakdown voltage Vbd is 30.5 V. That is, the variation (±0.5 V) in the excess voltage Vex in a case where a constant voltage is applied to the APD 201 without performing the reset operation becomes ±0.2 V. In this way, the variation in the excess voltage Vex is largely reduced. As a result, with respect to a variation of ±0.5 V in the breakdown voltage Vbd, the excess voltage Vex changes only within a range of ±0.2 V. To decrease ΔVex, it is understood from equation (3) that the capacitance C1 is set smaller than the capacitance C0. In this case, as is apparent from equation (2), the voltage Vp supplied to the first terminal 300 of the capacitive element 301 becomes high. In accordance with the characteristic required for the pixel 104 including the APD 201 and the performance and specification required for the photoelectric conversion apparatus 100 including the pixel 104, the values of the capacitances C0 and C1 are appropriately designed.

When operating the photoelectric conversion apparatus 100, it is necessary to set the excess voltage Vex to cause avalanche breakdown of the APD 201 arranged in each of all the pixels 104 in response to entry of a photon. In this case, if the voltage applied to the APD 201 is constant in each pixel 104, the excessive excess voltage Vex is unwantedly applied to the APD 201 having the low breakdown voltage Vbd due to the variation in the breakdown voltage Vbd of the APD 201. If the excessive excess voltage Vex is applied, energy required to detect a signal is large, and thus the power consumption of the overall photoelectric conversion apparatus 100 is large. If the excessive excess voltage Vex is applied, a light emission amount upon avalanche breakdown is large, and thus crosstalk is large. Furthermore, if the excessive excess voltage Vex is applied, deterioration of the characteristic of the APD 201 may be accelerated to decrease reliability, and the dark current of the APD 201 may be increased to increase noise.

On the other hand, with the above-described reset operation of the node A using capacitive coupling, it is possible to suppress the variation in the excess voltage Vex applied to the APD 201 among the pixels 104. Therefore, it is possible to suppress a situation in which if the excess voltage Vex varies, the probability of occurrence of avalanche breakdown caused by entry of a photon into the APD 201 varies, and the sensitivity varies among the pixels 104. It is possible to implement the photoelectric conversion apparatus 100 that includes a SPAD element having excellent characteristics such as low power consumption, small crosstalk, high reliability, and a small dark current by suppressing the variation in the excess voltage Vex.

Next, the second embodiment of the present disclosure will be described. The following event is assumed to perform the operation described above in the first embodiment and this embodiment copes with this.

If a period from when a node A is reset by the above-described reset operation until a photon enters an APD 201 is long, the node A may not be able to keep a potential Vh. Although a high reverse bias voltage is applied to the APD 201, a leakage current that does not cause avalanche breakdown can flow between the anode and cathode of the APD 201. A case where the leakage current gradually decreases the potential of the cathode of the APD 201, that is, the node A is assumed. Assume that the potential of the node A continuously decreases due to the leakage current of the APD 201, and becomes 1.4 V that is lower than the threshold (for example, 1.5 V) of a waveform shaping circuit 210 using an inverter although avalanche breakdown of the APD 201 does not occur. At this time, if a control pulse 308 is supplied, a node D transitions to H level. In this case, the reset operation is performed, as described above, thereby resetting the node A. Like the above-described examples of the numerical values, in a case where a breakdown voltage Vbd of the APD 201 is 29.5 V, a potential Vb of the node A upon avalanche breakdown of the APD 201 is 0 V, and a potential Vh of the node A after the reset operation should be 2.2 V. However, if the potential of the node A decreases, as described above, the node A is reset in a state as if the potential Vb were 1.4 V. In this case, in the examples of the numerical values given in the above-described voltage (potential) relationship, when an H-level pulse is applied to a control pulse 304 and the node A and a node C are electrically connected, the potential of the node A is 1.04 Vin accordance with expression (1). Next, after a voltage Vp is applied to a first terminal 300 of a capacitive element 301 and the reset operation ends, the potential of the node A is 3.04 V. That is, the state is reset to a state in which an excessive excess voltage Vex is applied. In this embodiment, an arrangement and operation for suppressing the operation will be described.

Figure 6:
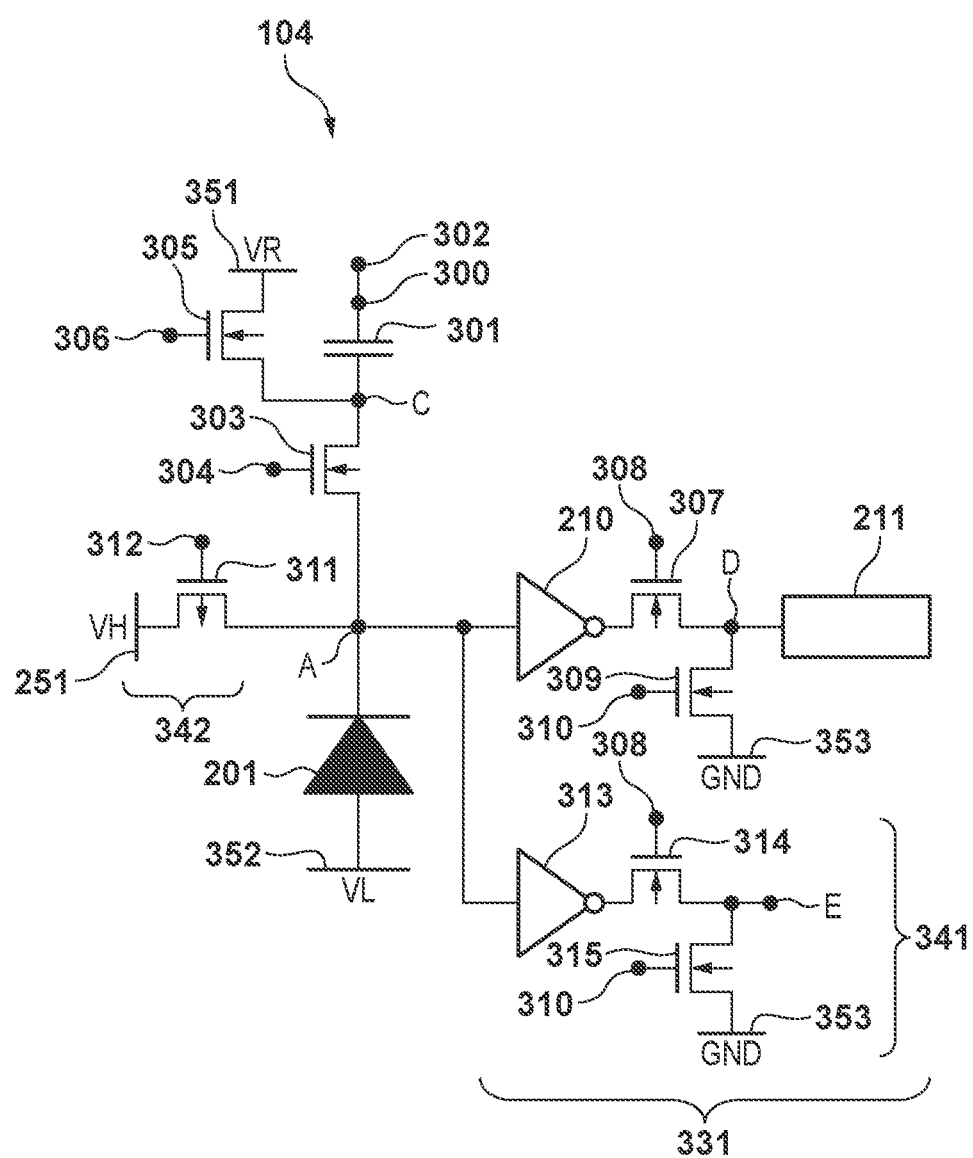
FIG. 6 is an equivalent circuit diagram showing a modification of the pixel shown in FIG. 4.

FIG. 6 is an equivalent circuit diagram showing an example of the arrangement of a pixel 104 according to this embodiment. As compared with the above-described first embodiment, in this embodiment, a detection circuit 331 further includes a change detection circuit 341 that is connected to the node A and detects a change of the potential of the node A smaller than a change of the potential for the waveform shaping circuit 210 using an inverter to output a signal representing detection of avalanche breakdown, and a reset circuit 342 that resets the potential of the node A to a predetermined potential in response to detection of a change of the potential of the node A by the change detection circuit 341.

For example, the change detection circuit 341 includes an inverter 313 connected to the node A, whose threshold for outputting a signal is different from that of the waveform shaping circuit 210. For the inverter 313, the threshold is set to output a signal in a case where a change of the potential of the node A is small, as compared with the inverter used as the waveform shaping circuit 210. For example, if the threshold of the inverter used as the waveform shaping circuit 210 is 1.5 V, the threshold of the inverter 313 may be 1.8 V. The above-described thresholds are used as examples of numerical values in the following description.

In addition to the inverter 313, the change detection circuit 341 can include switch elements 314 and 315. The switch element 314 is arranged between the inverter 313 and a node E as an output node of the change detection circuit 341. The node E is a node that temporarily holds the output state of the inverter 313, and may be a simple capacitor. The switch element 315 is arranged between the node E and a potential supply line 353 to reset the node E to a voltage GND supplied to the potential supply line 353. The switch element 314 may be controlled by the control pulse 308, similar to a switch element 307. The switch element 315 may be controlled by a control pulse 310, similar to a switch element 309. By controlling the switch elements 307 and 314 (switch elements 309 and 315) by the same control pulse 308 (control pulse 310), it is possible to control the number of output terminals of the control circuit 110 and the number of driving lines. Each of the switch elements 314 and 315 may be an n-type MOS transistor.

The reset circuit 342 includes a switch element 311 arranged between a potential supply line 251 and the node A. As shown in FIG. 6, the switch element 311 may be a p-type MOS transistor. The potential supply line 251 is supplied with a voltage VH. The voltage VH is a power supply potential for directly resetting the node A, and may be set to a value obtained by adding the design value of the excess voltage Vex to the average value of the potential Vb (the potential Vb (0.5 V in the above-described voltage (potential) relationship) in a case where the breakdown voltage Vbd of the APD 201 is 30 V). Furthermore, the voltage VH may be set to a value obtained by adding the design value of the excess voltage Vex to the maximum value of the potential Vb that varies in accordance with the variation in the breakdown voltage Vbd of the APD 201. In this example, Vb=0.5 V and Vex=2.0 V are set, and then VH=2.5 V is obtained.

FIG. 7 is a timing chart for explaining an example of the operation of the pixel 104 according to this embodiment. A control pulse 312 is a signal input to the control terminal of the switch element 311. While the control pulse 312 is at L level, the switch element 311 is in the ON state, and while the control pulse 312 is at H level, the switch element 311 is in the OFF state. The control pulse 312 can be supplied from the control circuit 110 via the driving line. Control pulses 302 and 306 and the control pulses 304, 308, and 310 are the same as in the above-described first embodiment. FIG. 7 shows changes of the potentials of the control pulses 302, 304, 306, 308, 310, and 312 and the nodes A, D, and E. In FIG. 7 as well, a timing at which a photon enters the APD 201 is indicated by "↓".

In the timing chart shown in FIG. 7, a photon enters the APD 201, and the node A is reset by the control pulses 302, 304, and 306, as in the first embodiment. After that, no photon enters the APD 201, and the potential of the node A gradually decreases. Assume here that the potential of the node A decreases to a voltage below 1.8 V as the threshold voltage of the inverter 313 before the third H-level pulse of the control pulse 308 shown in FIG. 7 is supplied. In this case, when the third H-level pulse of the control pulse 308 is supplied, the potential of the node A becomes higher than a threshold voltage of 1.5 V of the waveform shaping circuit 210 using the inverter and lower than 1.8 V as the threshold voltage of the inverter 313. Therefore, the inverter 313 outputs a signal and the node E changes to H level but the waveform shaping circuit 210 outputs no signal and thus the node D is maintained at L level.

Since a change of the potential of the node A caused by avalanche breakdown is abrupt, if avalanche breakdown of the APD 201 occurs, the potential of the node A exceeds both the thresholds of the waveform shaping circuit 210 and the inverter 313. Therefore, both the waveform shaping circuit 210 and the inverter 313 output signals, respectively, and the nodes D and E are set to H level. On the other hand, a change of the potential of the node A caused by a leakage current of the APD 201 is gentle. Thus, when the control pulse 308 is set to H level at an appropriate period, a decrease in potential of the node A caused by a leakage current can be captured by the inverter 313 before an output change of the waveform shaping circuit 210 using the inverter occurs. This can reset the node A by the reset circuit 342.

In a case where the node D is at L level and the node E is at H level, an L-level pulse is supplied to the control pulse 312, thereby resetting the node A to the voltage VH. This control pulse 312 can be implemented by an AND operation of three inputs of a driving pulse serving as the base of the control pulse 312 shown in FIG. 7 and set to L level at a predetermined period (a driving pulse including L level pulses indicated by dotted lines in the control pulse 312), the inverted level of the node D, and the level of the node E. For example, in the control circuit 110, an AND gate of three inputs to which the driving pulse serving as the base of the control pulse 312 and set to L level at a predetermined period, the inverted level of the node D, and the level of the node E are supplied, respectively, may be arranged.

In the above-described voltage (potential) relationship, since a potential obtained after the node A is reset by the reset circuit 342 is 2.5 V (the voltage VH of the potential supply line 251), and the potential Vb is 0.0 V, the excess voltage Vex is 2.5 V. Therefore, the excess voltage Vex obtained after the reset by the reset circuit 342 is higher than 2.0 V as the design value of the excess voltage Vex. Furthermore, the potential (2.5 V) of the node A obtained after the reset by the reset circuit 342 is higher than the potential Vh (2.2 V) of the node A at the time of the reset by the above-described reset operation after avalanche breakdown of the APD 201. Therefore, the excess voltage Vex obtained after the reset using the reset circuit 342 is higher than the excess voltage Vex applied by the reset operation after avalanche breakdown. However, the potential (2.5 V) of the node A obtained after the reset by the reset circuit 342 is lower than the potential (3.04 V) applied to the APD 201 in the reset operation performed by the control pulses 302, 304, and 306 in a case where there is a leakage current. That is, it is understood that the excess voltage Vex excessively applied is largely reduced.

It is considered that the frequency of the reset of the node A caused by the leakage current of the APD 201 is lower than that of the reset operation performed after avalanche breakdown of the APD 201. That is, the reset of the node A caused the leakage current of the APD 201 is rarely performed, and most of the reset operations of the node A are reset operations according to avalanche breakdown. Therefore, it is possible to suppress the variation in the excess voltage Vex applied to the APD 201 among the pixels 104.

In this embodiment as well, the reset operation after avalanche breakdown of the APD 201 is performed, similar to the above-described first embodiment. Furthermore, according to this embodiment, a reset operation along with the excessive excess voltage Vex caused by the leakage current of the APD 201 can be suppressed. As a result, it is possible to implement a photoelectric conversion apparatus 100 that includes a SPAD element having more excellent characteristics such as low power consumption, small crosstalk, high reliability, and a small dark current.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2022-119834, filed Jul. 27, 2022, which is hereby incorporated by reference herein in its entirety.

What is claimed is:

1. A photoelectric conversion apparatus in which a plurality of pixels are arranged, wherein each of the plurality of pixels comprises:
   an avalanche photodiode arranged between a first potential supply line and a second potential supply line;
   a first switch element arranged between the first potential supply line and the avalanche photodiode;
   a second switch element arranged between the first switch element and the avalanche photodiode;
   a capacitive element including a first terminal and a second terminal connected to a first node that connects the first switch element and the second switch element;
   a detection circuit configured to detect occurrence of avalanche breakdown of the avalanche photodiode in accordance with a change of a potential of a second node that connects the second switch element and the avalanche photodiode; and
   a control circuit,
   wherein the control circuit is configured to perform a reset operation of resetting the potential of the second node in response to detection of avalanche breakdown by the detection circuit,
   wherein in the reset operation, the control circuit is configured to set the second switch element to an ON state to apply a predetermined voltage to the first terminal, and
   wherein in the reset operation, after applying the predetermined voltage to the first terminal, the control circuit is configured to set the second switch element from the ON state to an OFF state, and then ends the application of the predetermined voltage to the first terminal.

2. The apparatus according to claim 1, wherein before performing the reset operation, the control circuit is configured to set the first switch element to an ON state and reset the first node to a voltage supplied from the first potential supply line.

3. The apparatus according to claim 1, wherein the detection circuit is configured to perform an operation for detecting avalanche breakdown at a predetermined period.

4. The apparatus according to claim 1, wherein the detection circuit is configured to perform an operation for detecting avalanche breakdown at a predetermined period,
   wherein the reset operation is configured to be performed at the same period as the predetermined period,
   wherein the control circuit is configured to perform the reset operation at a timing immediately after the detection circuit detects avalanche breakdown among timings at which the reset operation can be performed, and
   wherein in a case where the detection circuit detects no avalanche breakdown, the control circuit does not perform the reset operation regardless of the timings at which the reset operation can be performed.

5. The apparatus according to claim 1, wherein the detection circuit comprises:
   (1) an inverter connected to the second node and configured to output a signal indicating detection of avalanche breakdown in accordance with the change of the potential of the second node;
   (2) a change detection circuit connected to the second node and configured to detect the change of the potential of the second node smaller than the change of the potential for the inverter to output the signal; and
   (3) a reset circuit configured to reset the potential of the second node to a predetermined potential in response to detection of the change of the potential of the second node by the change detection circuit,
   wherein the reset circuit comprises a third switch element arranged between a third potential supply line and the second node, and wherein the predetermined potential is higher than the potential of the second node at the time of reset by the reset operation.

6. The apparatus according to claim 1, wherein the first switch element and the second switch element are n-type MOS transistors.

7. The apparatus according to claim 6, wherein a threshold of the first switch element is lower than a threshold of the second switch element.

8. A photoelectric conversion apparatus in which a plurality of pixels are arranged, wherein each of the plurality of pixels comprises:
   an avalanche photodiode arranged between a first potential supply line and a second potential supply line;
   a first switch element arranged between the first potential supply line and the avalanche photodiode;
   a second switch element arranged between the first switch element and the avalanche photodiode;
   a capacitive element including a first terminal and a second terminal connected to a first node that connects the first switch element and the second switch element;
   a detection circuit configured to detect occurrence of avalanche breakdown of the avalanche photodiode in accordance with a change of a potential of a second node that connects the second switch element and the avalanche photodiode; and
   a control circuit,
   wherein the control circuit is configured to perform a reset operation of resetting the potential of the second node in response to detection of avalanche breakdown by the detection circuit, and
   wherein in the reset operation, the control circuit is configured to set the second switch element to an ON state to apply a predetermined voltage to the first terminal, and
   wherein after performing the reset operation, the control circuit is configured to control the second switch element to an OFF state until the detection circuit detects avalanche breakdown.

9. The apparatus according to claim 8, wherein in the reset operation, after applying the predetermined voltage to the first terminal, the control circuit is configured to set the second switch element from the ON state to an OFF state, and then ends the application of the predetermined voltage to the first terminal.

10. The apparatus according to claim 8, wherein before performing the reset operation, the control circuit is configured to set the first switch element to an ON state and reset the first node to a voltage supplied from the first potential supply line.

11. The apparatus according to claim 8, wherein the detection circuit is configured to perform an operation for detecting avalanche breakdown at a predetermined period.

12. The apparatus according to claim 8, wherein the detection circuit comprises:
   (1) an inverter connected to the second node and configured to output a signal indicating detection of avalanche breakdown in accordance with the change of the potential of the second node;
   (2) a change detection circuit connected to the second node and configured to detect the change of the potential of the second node smaller than the change of the potential for the inverter to output the signal; and
   (3) a reset circuit configured to reset the potential of the second node to a predetermined potential in response to detection of the change of the potential of the second node by the change detection circuit,
   wherein the reset circuit comprises a third switch element arranged between a third potential supply line and the second node, and
   wherein the predetermined potential is higher than the potential of the second node at the time of reset by the reset operation.

13. The apparatus according to claim 8, wherein the first switch element and the second switch element are n-type MOS transistors.

14. The apparatus according to claim 13, wherein a threshold of the first switch element is lower than a threshold of the second switch element.

15. A photoelectric conversion apparatus in which a plurality of pixels are arranged, wherein each of the plurality of pixels comprises:
   an avalanche photodiode arranged between a first potential supply line and a second potential supply line;
   a first switch element arranged between the first potential supply line and the avalanche photodiode;
   a second switch element arranged between the first switch element and the avalanche photodiode;
   a capacitive element including a first terminal and a second terminal connected to a first node that connects the first switch element and the second switch element; and
   a detection circuit configured to detect occurrence of avalanche breakdown of the avalanche photodiode in accordance with a change of a potential of a second node that connects the second switch element and the avalanche photodiode,
   wherein the detection circuit comprises: (1) an inverter connected to the second node and configured to output a signal indicating detection of avalanche breakdown in accordance with the change of the potential of the second node;
   (2) a change detection circuit connected to the second node and configured to detect the change of the potential of the second node smaller than the change of the potential for the inverter to output the signal; and (3) a reset circuit configured to reset the potential of the second node to a predetermined potential in response to detection of the change of the potential of the second node by the change detection circuit.

16. The apparatus according to claim 15, wherein the reset circuit comprises a third switch element arranged between a third potential supply line and the second node.

17. The apparatus according to claim 16, wherein the third switch element is a p-type MOS transistor.

18. The apparatus according to claim 15, wherein the inverter is defined as a first inverter, and
   wherein the change detection circuit comprises a second inverter connected to the second node, whose threshold for outputting a signal is different from a threshold of the first inverter.

19. The apparatus according to claim 15, wherein the first switch element and the second switch element are n-type MOS transistors.

20. The apparatus according to claim 19, wherein a threshold of the first switch element is lower than a threshold of the second switch element.

21. The apparatus according to claim 15, further comprising a control circuit,
   wherein the control circuit is configured to perform a reset operation of resetting the potential of the second node in response to detection of avalanche breakdown by the detection circuit, wherein in the reset operation, the control circuit is configured to set the second switch element to an ON state to apply a predetermined voltage to the first terminal, and wherein in the reset operation, after applying the predetermined voltage to the first terminal, the control circuit is configured to set the second switch element from the ON state to an OFF state, and then ends the application of the predetermined voltage to the first terminal.

* * * * *